(12) United States Patent
Butler

(10) Patent No.: US 7,098,990 B2
(45) Date of Patent: Aug. 29, 2006

(54) LITHOGRAPHIC APPARATUS, DEVICE MANUFACTURING METHOD, AND DEVICE MANUFACTURED THEREBY

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 37 days.

(21) Appl. No.: 10/946,337

(22) Filed: Sep. 22, 2004

(65) Prior Publication Data

US 2005/0110970 A1    May 26, 2005

(30) Foreign Application Priority Data

Sep. 22, 2003  (EP)  ................................. 03077992

(51) Int. Cl.
G03B 27/42 (2006.01)
G03B 27/58 (2006.01)
G03B 27/62 (2006.01)

(52) U.S. Cl. .............................. 355/53; 355/72; 355/75

(58) Field of Classification Search .................. 355/53, 355/72–76; 356/399–401; 318/560, 565
See application file for complete search history.

(56) References Cited

U.S. PATENT DOCUMENTS

| | | | |
|---|---|---|---|
| 4,792,737 A | | 12/1988 | Goff et al. |
| 5,184,055 A | | 2/1993 | Ohishi et al. |
| 5,504,407 A | * | 4/1996 | Wakui et al. .......... 318/568.17 |
| 5,696,590 A | | 12/1997 | Makita |
| 6,359,688 B1 | * | 3/2002 | Akimoto et al. ............ 356/401 |
| 6,870,599 B1 | * | 3/2005 | Kurosawa ..................... 355/53 |
| 2002/0109823 A1 | | 8/2002 | Binnard et al. |
| 2002/0145716 A1 | | 10/2002 | Kurosawa |

FOREIGN PATENT DOCUMENTS

JP    07319548 A    12/1995

OTHER PUBLICATIONS

Australian Patent Office Search Report, dated Sep. 14, 2005.

* cited by examiner

*Primary Examiner*—Henry Hung Nguyen
(74) *Attorney, Agent, or Firm*—Pillsbury Winthrop Shaw Pittman, LLP

(57) ABSTRACT

A lithographic apparatus including a position control system to control a position of a moveable object is presented, The position control system includes a position controller, an object represented as an object filter, a position feedback circuit, and an acceleration control system. The acceleration control system includes a subtractor and a first filter in a first circuit branch and a second filter in a second circuit branch. A position controller signal output from the position controller is input into the subtractor of the acceleration control system. An external disturbance force, however, is directly exerted upon the object. Thus, a first transfer function from the input of the subtractor to the acceleration of the object for the position controller force may be different than a second transfer function from the input of the object to the acceleration of the object for the disturbance force. Preferably, the first transfer function is identical to a transfer function for the position controller force in case no acceleration control system is present in the position control system.

17 Claims, 4 Drawing Sheets

LITHOGRAPHIC APPARATUS, DEVICE MANUFACTURING METHOD, AND DEVICE MANUFACTURED THEREBY

PRIORITY INFORMATION

This application claims priority from European Patent Application No. 03077992.0, filed Sep. 22, 2003, the content of which is herein incorporated by reference in its entirety.

BACKGROUND

1. Field of the Invention

The present invention relates to lithographic apparatus and methods.

2. Description of the Related Art

Lithographic projection apparatus can be used, for example, in the manufacture of integrated circuits (ICs). In such a case, a patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time.

In the current apparatus, in which the patterning device comprises a mask, a distinction can be made between two different types of machines. In one type of lithographic projection apparatus, each target portion is irradiated by exposing the entire mask pattern onto the target portion at once; such an apparatus is commonly referred to as a wafer stepper or step-and-repeat apparatus.

In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In manufacturing processes using a lithographic projection apparatus, pattern on the patterning device (e.g. in a mask) is imaged or exposed onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The term "patterning device" as hereinafter employed should be broadly interpreted as referring to a device that can be used to endow an incoming radiation beam with a patterned cross-section, corresponding to a pattern that is to be created in a target portion of the substrate. Generally, the pattern will correspond to a particular functional layer in a device being created in the target portion, such as an integrated circuit or other device (see below). Examples of such patterning device include:

a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction than unaddressed mirrors; in this manner, the reflected beam is patterned according to the addressing pattern of the matrix-addressable mirrors. The required matrix addressing can be performed using suitable electronic devices. In both of the situations described hereabove, the patterning device can include one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and a programmable LCD array: An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

The movement of one or more moveable mask tables, one or more moveable substrate tables and other moveable tables, or other moveable objects being part of the lithographic projection apparatus in general, may be controlled by a position control system. Conventionally, e.g. as disclosed in European Patent No. 1,265,106, a position control system for an object includes a position controller and a position feedback circuit. A desired position is supplied to the position controller which calculates the required movement of the object. The position controller exerts a position control force on the object corresponding to the required movement. Via the position feedback circuit, the position controller receives information on the actual position of the object. If the determined actual position deviates from the desired position, the position controller may change the position control force until the object reaches the desired position.

A deviation of the actual position from the calculated position may result from external forces. In case of a multi-stage lithographic apparatus, air-pressure changes induced by an acceleration of one stage may lead to an external disturbance force on another stage, for example. The sensitivity of the position control system to external forces should-be as small as possible, but other design parameters and requirements limit the possibilities to decrease the sensitivity to external forces.

SUMMARY

Embodiments of the invention include a lithographic apparatus comprising at least one moveable object having a mass, which can be a substrate table or a mask table, and a position control system configured to control a position of the moveable object, the position control system including a position controller configured to output a position controller force; and a position feedback circuit configured to feed back a determined actual position of the object to an input of the position controller.

A lithographic projection apparatus generally includes one or more objects, which may be moveable, such as a mask table, a substrate table, and the like. Hereinafter, the lithographic projection apparatus including any moveable objects will be described in further detail.

In an embodiment of the present invention, the sensitivity of an object position control system to external forces is decreased. In particular, there is provided a position control system for moveable objects in a multi-stage lithographic projection apparatus.

In the present invention, design parameters and requirements are not impacted when implementing measures to decrease the sensitivity of an object position control system to external forces.

A lithographic projection apparatus, according to an embodiment of the invention, includes an acceleration control system including a first acceleration circuit branch including a subtractor into which the position controller force is input; and a first filter having a first gain into which the output of the subtractor is input and outputting a control force which is to be exerted on the object; and a second acceleration circuit branch including a second filter having a second gain and into which an acceleration control signal is input, the output of the second circuit branch being input into said subtractor to subtract the output of the second circuit branch from the position controller force.

A lithographic apparatus with one or more position control systems according to an embodiment of the present invention employs an acceleration feedback or an acceleration error feedforward via a second acceleration circuit branch. When a force is exerted on an object, the object tends to accelerate. Thus, when an external force is exerted on the object in addition to the position control force, the object does not accelerate as calculated by the position control system. Using feedback of the acceleration of the object or of the acceleration error, i.e. the difference between the actual acceleration of the object and the intended acceleration, the additional acceleration as a result of the external disturbance force may be compensated, or at least diminished.

However, an acceleration control system may introduce a gain, which may also influence the position control force. However, by placing at least two filters, the first filter and the second filter, in the acceleration control system, the system according to another embodiment of the present invention may be designed such that its characteristics differ for forces input into the system at different input nodes. The influence of the acceleration control system on the position control force may thus be differentiated from the influence of the acceleration control system on the disturbance force.

The first filter having a first gain arranged in a first acceleration circuit branch may be located between the position controller and the object, in an embodiment of the invention. The second filter may be located in an acceleration feedback circuit, e.g. between the output of an object filter, i.e. the actual acceleration, and the input of the first filter, or in an acceleration feedforward circuit, e.g. having an acceleration error signal as input. In each case, the signal input into the second filter is a signal derived from the actual acceleration and may be regarded as an acceleration control signal. Thus, the position controller force is filtered by the first filter before it is applied to the object, but after a filtered acceleration signal has been subtracted therefrom by a subtractor. The disturbance force on the other hand is directly exerted on the object, resulting in a possibly different transfer function of the system for the disturbance force.

It will be appreciated that a transfer function of the system for a position controller force is a transfer function from the input of subtractor as input node to the acceleration of the object as the output. A transfer function for a disturbance force is a transfer function from the input of the object filter as input node to the acceleration of the object as the output.

A force exerted on an object results in an acceleration of the object. The amount of acceleration results from the force applied to the object: the force may be considered to be filtered by the object. Thus, in a schematic representation of the system, the object may be (and hereinafter will be) represented as an object filter having an object gain.

An advantage of the position control system employing an acceleration control system according to an embodiment of the present invention is the differentiated transfer functions for a position controller force and an external force. This difference allows for a system design that decreases the influence of an external force with a minimum of influence on any other design parameter or requirements.

In an embodiment of the invention, the acceleration control system has a first transfer function for the position controller force input to the subtractor and a second transfer function for a disturbance force directly exerted on the object, the first transfer function being substantially equal to an object gain and the second transfer function being generally smaller than the object gain, wherein the object gain is substantially equal to an inverse of the mass of the object. With the transfer function of the acceleration control system for the position control force equaling the object gain, the position control system, and in particular the position controller, does not need to be adapted for the added acceleration control system. Without the acceleration control system, the position controller already experienced the object gain, and thus virtually nothing changed. However, without the acceleration control system, a disturbance force also experienced the object gain, but with the acceleration control system having a second transfer function for the disturbance force smaller than the object gain, the experienced object gain is smaller. Therefore, the object accelerates less due to a disturbance force than without the acceleration control system.

In an embodiment of the present invention, the acceleration control system has a selected loop gain, the first transfer function being $$G1 = \frac{1}{m},$$

the second transfer function being $$G2 = \frac{1}{m + Kl},$$

and the loop gain being $$Kl = Kf \cdot Ks.$$

wherein m is the mass of the object, Kl is the loop gain, Kf is the first gain of the first filter and Ks is the second gain of the second filter.

In a position control system including the acceleration control system having the first and second transfer functions G1 and G2, the acceleration due to disturbance forces may be decreased to any arbitrarily selected level. The transfer functions G1 and G2 may denote the relation of the acceleration in response to the respective forces (the effected quantities by the transfer functions, thus the output, are object accelerations). The transfer function for the position controller is held constant to the object gain, but the transfer function for a disturbance force may be selected by selecting a loop gain Kl. Any loop gain Kl may be selected and implemented by selecting a corresponding first gain and second gain. However, it should be noted that filter design may impose limitations to the obtainable first gain and second gain, and thus to the obtainable loop gain.

It will be appreciated that a suitable first filter and second filter characteristics can be deduced from the given transfer functions and loop gain, and to design corresponding filters.

However, for completeness, suitable gains are given: a suitable first gain being $$Kf = 1 + \frac{Kl}{m}, \text{ and}$$

a suitable second gain being $$Ks = \frac{Kl}{1 + \frac{Kl}{m}}.$$

In an embodiment of the invention, the first transfer function G1 does not substantially vary as a function of an input frequency, and the second transfer function G2 varies as a function of an input frequency. To ensure system stability under all circumstances, the second transfer function for a disturbance force may vary as a function of the frequency of the applied disturbance force. For higher frequencies, the object gain Ho generally starts deviating from 1/m, for example due to dynamics and/or time delays. To avoid instability, it is therefore advantageous to give Kl a smaller gain for higher frequencies, because stability is guaranteed if the product of Kl and Ho is smaller than 1, irrespective of the phase. The result is that G2 increases up to 1/m for increasing frequency.

As the above-described system instability may occur in particular at high frequencies, the loop gain Kl, according to an embodiment of the invention, decreases with increasing frequency, resulting in a second transfer function G2 that increases with increasing input frequency. With the increasing transfer function, it may approach the original object gain. In that case, the acceleration control system may not influence any force above a certain frequency applied to the object.

In an embodiment of the present invention in which the second transfer function G2 is a function of an input frequency, the loop gain Kl is provided by a frequency dependent loop filter Hl(s), the frequency dependency of the first filter Hf being $$Hf(s) = 1 + \frac{Hl(s)}{m},$$

and the frequency dependency of the second filter Hs(s) being $$Hs(s) = \frac{Hl(s)}{1 + \frac{Hl(s)}{m}}.$$

To obtain a frequency dependent second transfer function G2, the loop gain Kl may be a function of a frequency, i.e. a loop filter Hl(s). Consequently, the first filter and the second filter may become functions of the frequency, as the first filter and the second filter may be constructed using said loop filter. A suitable loop filter is a second-order low-pass filter or an integrator.

It should be noted, that despite the frequency dependency of the first filter and the second filter, the first transfer function is still substantially equal to the inverse of the mass of the object, and therefore independent from any frequency.

In an embodiment of the present invention, the position control system is a discrete time system. Such a digital system may be easily designed and cost-effective.

In a further embodiment of the invention, the position control system has at least a process transfer function delay $Dp=z^{-p}$ in series with the object gain and an acceleration measurement delay $Da=z^{-q}$ in the acceleration feedback circuit in series with the second gain. The position control system may exhibit delays anywhere in the system, as stated above. The delays may be measured, calculated or otherwise deduced and thereafter modeled and included in the system design.

Two significant delays that may be present in the system are a process transfer function delay Dp and an acceleration measurement delay Da. The process transfer function delay Dp represents an overall delay that occurs between the moment the position controller outputs a position controller force and the moment the object accelerates due to that position controller force. The acceleration measurement delay Da represents any delay that occurs during the measurement of the acceleration of the object.

In a digital system, the two delays Dp and Da may be represented as $Dp=z^{-p}$ and $Da=z^{-q}$ and introduced in the system design. In this representation, p and q are not limited to integer numbers. Introducing these two delays in the digital system design leads to a suitable first filter being:

$$Hf(z) = 1 + Hl(z)\frac{z^{-(p+q)}}{m},$$

and a suitable second filter being:

$$Hs(z) = \frac{Hl(z)}{1 + Hl(z)\frac{z^{-(p+q)}}{m}}.$$

Although the delay-filters are presented and described in combination with a digital position control system, it should be understood that the delay filters may analogously be arranged in an analogue position control system as disclosed hereinabove.

While any filter has been described by its characteristics, formulated in equations, it will be appreciated that implementation of the filters may be done using the given description and formulas in a position control system according to embodiments of the present invention.

In a further embodiment of the present invention there is provided a position control system as above described in relation to a lithographic apparatus.

According to another embodiment of the present invention, there is provided a device manufacturing method including controlling a position of at least one moveable object, in particular a substrate, a patterning device, or both; wherein controlling a position includes exerting a control force on the moveable object; determining an actual position of the moveable object; feeding back the position to an input of a position controller, subtracting a filtered acceleration control signal from a position controller force using a subtractor comprised in a first acceleration circuit branch; filtering the output of the subtractor using a first filter having a first gain comprised in the first acceleration circuit branch; determining an acceleration of the moveable object; filtering an acceleration control signal using a second filter having a second gain comprised in a second acceleration circuit branch; and supplying the output of the second acceleration circuit branch to the subtractor comprised in the first acceleration circuit branch.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTIONS OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
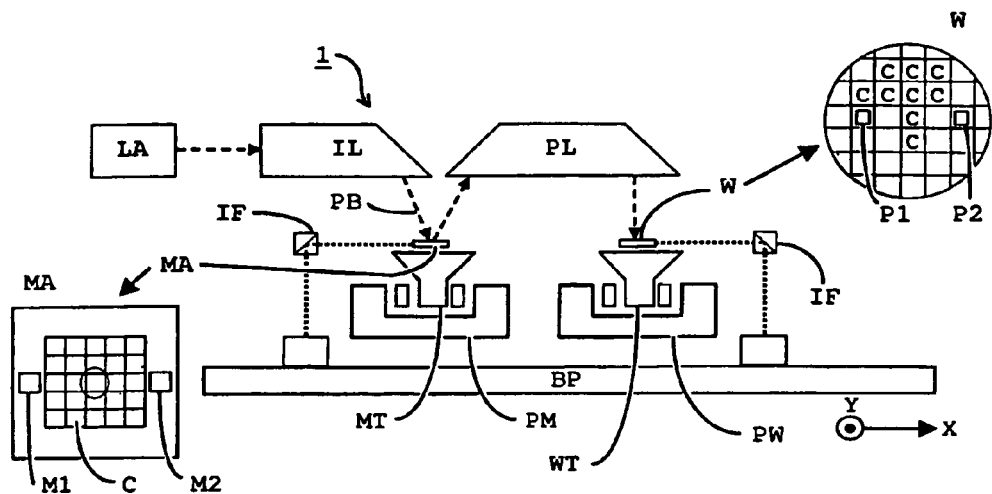
FIG. 1 depicts a lithographic projection apparatus according to an embodiment of the invention.

FIG. 1 schematically depicts a lithographic projection apparatus 1 according to an embodiment of the invention. The apparatus includes a radiation system IL, configured to supply a beam PB of radiation. In this particular case, the radiation system also includes a radiation source LA. The apparatus further includes a first object table (mask table) MT provided with a mask holder configured to hold a mask MA (e.g. a reticle), and connected to a first positioning device PM configured to accurately position the mask with respect to the projection system ("lens"), item PL. The apparatus also includes a second object table (substrate table) WT provided with a substrate holder configured to hold a substrate W (e.g. a resist-coated silicon wafer), and connected to a second positioning device PW configured to accurately position the substrate with respect to the projection system ("lens"), item PL, the projection system ("lens") PL being configured to image an irradiated portion of the mask MA onto a target portion C (e.g. including one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA produces a beam of radiation. This beam is fed into an illumination system (illuminator) IL, either directly or after having traversed a conditioning device, such as a beam expander, for example. The illuminator IL may include an adjusting device configured to set the outer and/or inner radial extent (commonly referred to as σ-outer and σ-inner, respectively) of the intensity distribution in the beam. In addition, it will generally include various other components, such as an integrator and a condenser. In this way, the beam PB impinging on the mask MA has a desired uniformity and intensity distribution in its cross-section.

It should be noted with regard to FIG. 1, that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring means IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module and a short-stroke module, which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:

1. step mode: the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. another mode: the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

The positioning devices PM and PW may include the position control system according to embodiments of the present invention. The Figures and their description hereinafter will be dedicated to such position control systems. First, for a good understanding, the construction and operation of a position control system will be described in relation to a conventional position control system. Thereafter, embodiments of the present invention will be presented and described.

Figure 2:
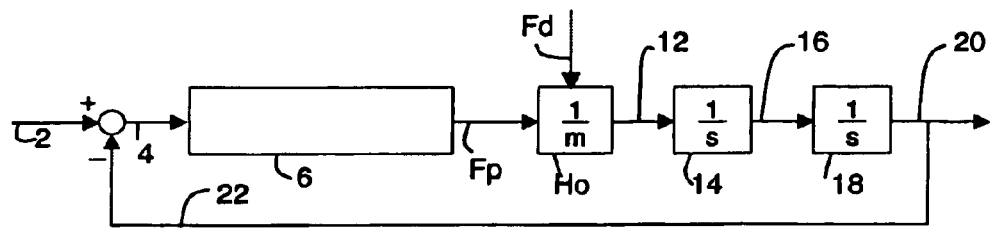
FIG. 2 is a schematic block diagram of a conventional position control system employing position feedback.

FIG. 2 shows a conventional position control system that employs position feedback for controlling the position of an object. Externally from the position control system, a desired absolute position is determined and fed to the position control system via a set point input 2. From the desired absolute position, a measured actual absolute position of the controlled object may be subtracted resulting in a desired relative movement signal 4 of the object. The desired relative movement signal 4 is then supplied to a position controller 6 via a position controller input. The position controller 6 is a device well known to a person skilled in the art and the controller 6 is capable of translating a movement signal into control signals. The position controller 6 may include, for example, a PID controller, a low-pass filter and an amplifier.

The control signal output from the position controller 6 may be referenced as a position controller force Fp, since the control signal acts upon the object as a force. The position controller force Fp results in an acceleration of the object depending on a mass m of the object, which is represented in the diagram as object filter Ho, having an object gain Ko. Apart from the mass m of the object, also other parameters, such as friction, may be present and represented by the object gain Ko, however, for simplicity, it is assumed that the object gain Ko only depends on the mass of the object.

Due to physical laws, velocity of the object equals the acceleration of the object integrated over time, depicted by means of integrator 14. Similarly, integration of a velocity signal 16 by an integrator 18 leads to a determined actual position signal 20. The position signal 20 is fed back to the input of the position control system via a position feedback circuit 22.

Not only the force Fp, output by the position controller, but also other forces may be exerted on the object. In case of a multistage lithographic apparatus, the object may be one stage. Air pressure changes induced by another stage may apply an external disturbance force on the stage. However, any external force disturbs the position control system as it results in an unexpected displacement of the object.

A disturbance force Fd is indicated in FIG. 2 by a dotted arrow, as it is not a physical component of the system. It is, however, included in FIG. 2 to show where the disturbance force Fd is to be considered to be input in the system as this is an important aspect for understanding the present invention.

A person skilled in the art will readily understand how the position control system of FIG. 2 generally functions. A position input at set point 2 is subtracted with a determined, i.e. calculated or measured, actual position signal 20 by a subtractor resulting in a desired movement signal 4. Based upon the desired movement 4, the position controller 6 determines the force to move the object to the desired position. The force Fp output from the position controller 6 is applied to the object. Further, the disturbance force Fd, which is assumed to be present in this case, is also applied to the object. The object accelerates as a result of the force resulting from the force Fp applied by the position controller 6, and by the disturbance force Fd, depending on the mass of the object represented by object filter Ho having object gain Ko equaling 1/m, m being the mass of the object.

By nature, the actual position signal 20 equals the double integrated acceleration signal 12. Schematically, this double integration is performed by integrators 14 and 18. If the acceleration signal 12 is desired to be known, it could be measured directly or derived from the position signal 20 by a double differentiation with respect to time. The determined actual position signal 20 is fed back to the subtractor. The desired movement signal 4 results. The actual movement may however be different from the desired movement that was intended to result from the force applied by the position controller 6 because of the disturbance force Fd. Thus, the position controller 6 needs to change the position controller force Fp to compensate for the disturbance force Fd.

Note that FIG. 2 does not include any feedforward circuits. However, in practice, feedforward circuits may be present. For example, the desired position 2 may correspond to a desired object acceleration. The desired object acceleration is generally processed, for example multiplied by the object mass, and added to the position controller force Fp. Other feedforward circuits may be present as well, depending on details of object characteristics.

Figure 3:
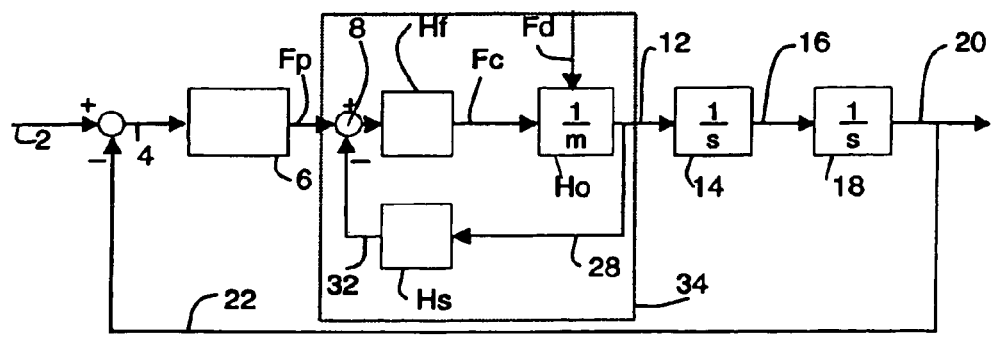
FIG. 3 is a schematic block diagram of a position control system according to an embodiment of the present invention.

FIG. 3 is a schematic diagram of a position control system employing position feedback and acceleration feedback, in accordance with an embodiment of the present invention. The diagram includes an acceleration control system 34. The acceleration control system 34 includes a first and a second acceleration circuit branch. The first circuit branch includes a subtractor 8 and a first filter Hf having a first gain Kf. The second circuit branch includes a second filter Hs having a second gain Ks. Further, an acceleration feedback signal 28 is input to the second filter Hs and the filtered acceleration feedback signal 32 is output from the second filter Hs and subtracted from the position controller force Fp output from the position controller 6 by subtractor 8. Not the position controller force Fp, but a control force Fc is exerted on the object. The control force Fc is output by the first filter Hf.

Figure 4A:
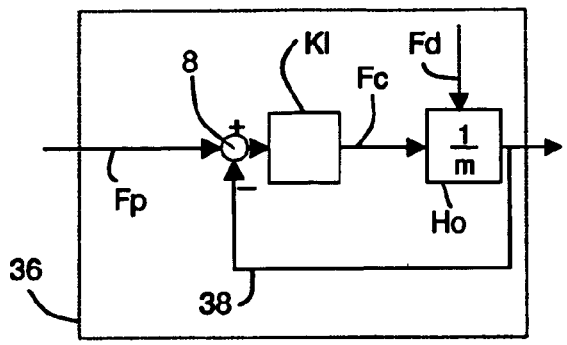
FIG. 4A is a schematic block diagram of a conventional acceleration control system.
Figure 4B:
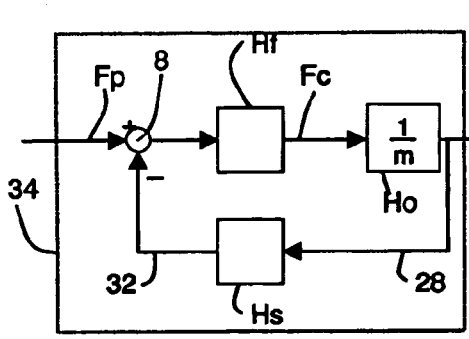
FIG. 4B is a schematic block diagram of an acceleration control system, according to an embodiment of the present invention, having a position controller force as an input.
Figure 4C:
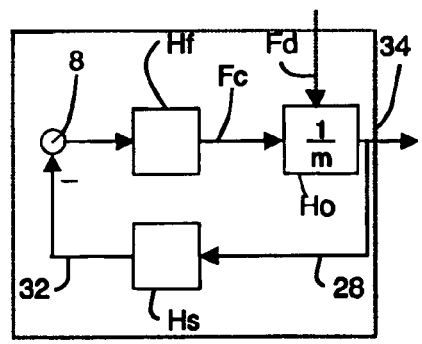
FIG. 4C is a schematic block diagram of an acceleration control system, according to an embodiment of the present invention, having a disturbance force as an input.

For a good understanding of the acceleration control system 34, reference is made to FIGS. 4A, 4B, and 4C before describing the functioning of the position control system according to FIG. 3.

FIG. 4A shows a general basic concept of an acceleration control system 36 including a loop gain Kl and the object filter Ho. Compared to the system illustrated in FIG. 2, the loop gain Kl and a feedback circuit 38 are added. The acceleration is related to the position controller force Fp by a gain Kl/(m+Kl). The acceleration is related to the disturbance force Fd by a gain 1/(m+Kl). Thus, a position controller force Fp results in a different acceleration compared to a system without the acceleration control system 36. In particular, when Kl is made frequency dependent so as to diminish the loop gain Kl for higher frequencies in view of delays or dynamics in Ho, the relation between position controller force Fp and the actual acceleration also becomes dependent on the frequency. Thus, the original object gain of 1/m is replaced by a frequency dependent gain. It is difficult for the position controller 6 to compensate this frequency dependent gain. The position controller 6 needs to be modified for this purpose, which is generally very difficult with regard to stability of the position control loop.

FIGS. 4B and 4C illustrate the acceleration control system 34, in accordance with an embodiment of the present invention. The control system 34 includes a subtractor 8, a first filter Hf having a first gain Kf and a second filter Hs having a second gain Hs. FIG. 4B illustrates the acceleration control system 34 with only the position controller force Fp as an input. FIG. 4C illustrates the same but only having the disturbance force Fd as an input. Both acceleration control systems of FIGS. 4B and 4C have the actual acceleration of the object as output.

The acceleration resulting from position controller force Fp should not be changed, i.e. increased or attenuated, by the acceleration control system 34, compared to the acceleration resulting from position controller force Fp in the system illustrated in FIG. 2. Thus, the gain of the acceleration control system 34 should equal 1/m for a position control force Fp input to the subtractor 8.

The gain of the acceleration control system 34 equals for an input into the subtractor 8

$$K = \frac{\frac{Kf}{m}}{1 + \frac{Kf \cdot Kb}{m}},$$

and as stated above should equal 1/m. Thus, a first constraint for the first gain Kf and second gain Ks is:

$$\frac{\frac{Kf}{m}}{1 + \frac{Kf \cdot Ks}{m}} = \frac{1}{m}.$$

Now referring to FIG. 4C, the disturbance force Fd should be attenuated with a loop gain Kl comparable to the loop gain introduced in FIG. 4A. In fact, the acceleration control system 34 illustrated in FIG. 4C is substantially identical to the circuit in FIG. 4A as, in this case, the first filter Hf and the second filter Hs may be combined and represented as one filter. Thus, the loop gain Kl may represent both filters and thus equal the first gain Kf multiplied by the second gain Ks:

$$Kl = Kf \cdot Ks,$$

resulting in a second constraint for the first gain Kf and the second gain Ks.

It is to be noted that employing an acceleration control system 34 according to an embodiment of the present invention results in an attenuation of an acceleration caused by a disturbance force Fd, whereas an acceleration caused by the position controller force is kept unchanged.

The two constraints described in relation to FIGS. 4B and 4C may be combined to obtain two expressions expressing the desired first gain Kf for the first filter Hf and the second gain Ks for the second filter Hs:

$$Kf = 1 + \frac{Kl}{m};$$

$$Ks = \frac{Kl}{1 + \frac{Kl}{m}} = \frac{Kl}{Kf}.$$

Figure 5A:
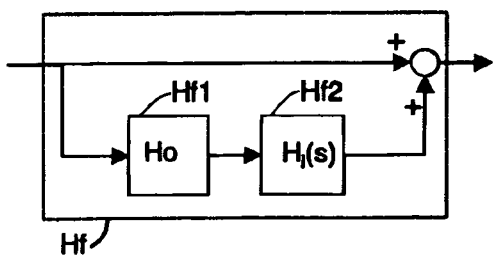
FIG. 5A is a schematic block diagram of a first filter according to an embodiment of the invention.

FIG. 5A illustrates an embodiment of a filter having the filter characteristics as formulated for the first filter Hf above. The filter includes a first filter Hf1 identical to the object filter Ho with respect to its characteristics and a second filter Hf2 corresponding to the loop filter Hi both put in a feed forward branch.

Figure 5B:
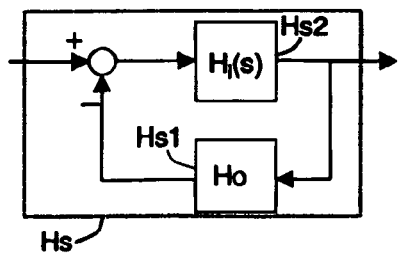
FIG. 5B is a schematic block diagram of a second filter according to an embodiment of the invention.

FIG. 5B illustrates a filter having the filter characteristics as formulated for the second filter Hs above, in accordance with an embodiment of the invention. The filter includes a first filter Hs1 identical to the object filter Ho with respect to its characteristics and a second filter Hs2 corresponding to the loop filter Hl. The first filter Hs1 is placed in a feedback circuit branch.

The physical embodiment of the filters Hf1 and Hs1, which are identical to the object filter Ho with respect to their characteristics, may be a computer implementation. That means that the illustrated filters are implemented in a signal processing device, a programmed computer device for example, which receives the input signal, filters the signal according to the implemented characteristics of the filter (in this case identical to the characteristics of the object filter), and outputs the result. In addition, also other parts of the system may be physically implemented in a well-known computer device or be implemented using any other kind of signal processor.

Figure 5C:
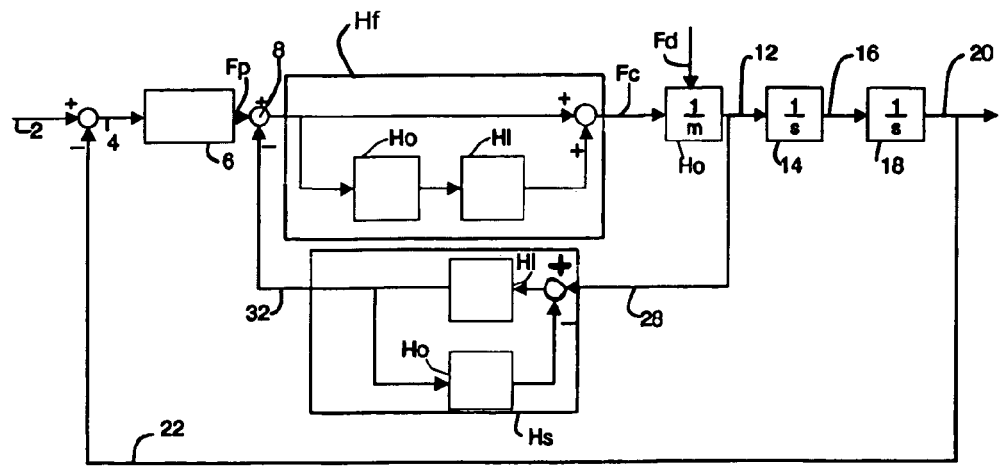
FIG. 5C is a schematic block diagram of a position control system according to an embodiment of the present invention.

FIG. 5C illustrates a position control system according to an embodiment of the present invention, wherein the filters introduced in relation to FIGS. 5A and 5B are implemented in the position control system employing acceleration feedback illustrated in FIG. 3. In FIG. 5C, a desired position signal is input to the system at set point 2. From the desired position the actual position signal 20 is subtracted resulting in a desired movement signal 4, which is input to a position controller 6. From the position controller force Fp, a filtered actual acceleration signal 32 is subtracted and input to the first filter Hf. Now, the output of the first filter Hf is the control force Fc applied to the object, represented as the object filter Ho. The actual acceleration is supplied to the second filter Hs and the output thereof is subtracted from the position controller force Fp as described above. From the actual acceleration signal 12, the actual position signal 20 may be calculated and supplied to the system input node, i.e. set point 2, to be subtracted from the input desired position. Again as stated above, usually, the position signal 20 is measured, and the actual acceleration may be determined there from.

In the illustrated position control system, any unexpected acceleration of the object because of a disturbance force Fd exerted on the object is compensated in an early stage by the acceleration feedback system 34.

It is to be noted, that in the position control system, there is still an unspecified filter present. The loop filter Hl has at this point not been specified. The acceleration control system is designed such, that the loop filter Hl only has an impact on a disturbance force Fd and does not influence the reaction to any position controller force Fp. Therefore, the loop filter Hl may be designed according to any suitable filter characteristics.

In an embodiment of the present invention, the loop filter Hl is designed as a frequency dependent filter, suppressing any low-frequency disturbance force Fd, but leaving any high-frequency disturbance force unchanged. In such an embodiment, the loop filter Hl may be a second-order low-pass filter or an integrator. However, the loop filter Hl may be frequency independent and thus being just a constant gain.

Figure 6:
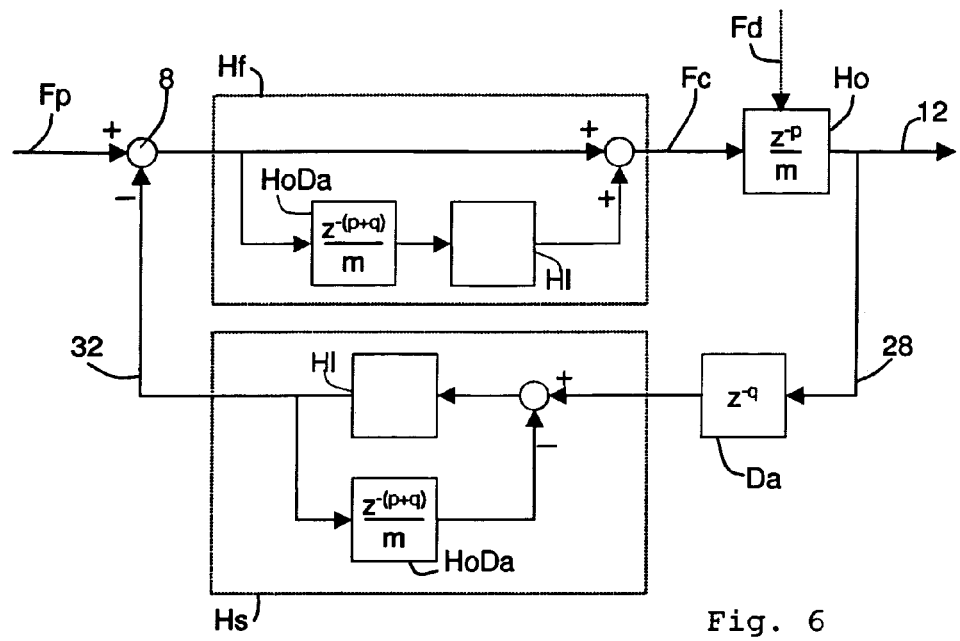
FIG. 6 is a schematic block diagram including delay filters according to an embodiment of the present invention

FIG. 6 illustrates another embodiment of the present invention. The present invention is embodied as a digital discrete time system. However, as may be in the above-described systems, there may be delays present in the system. Therefore, in FIG. 6, two possible delays are included in the position control system. A first delay present in the system may be a process transfer function delay, i.e. a delay from position controller output to actual acceleration of the object. A second delay may be an acceleration measurement delay.

The process transfer function delay is introduced in the position control system by amending the object filter Ho to include the delay. In discrete time, a delay is represented as $z^{-p}$, thus the object filter Ho becomes $z^{-p}/m$. The acceleration measurement delay is introduced as a separate delay filter located in the feedback branch of the acceleration control system 34.

An acceleration measurement delay filter Da equals $z^{-q}$. The amended and the added filter lead to amended characteristics of the overall position control system. In particular, the first gain G1 now changes to $z^{-p}/m$, i.e. remaining the same as the object gain including delay. However, basically the digital position control system including filters representing one or more delays functions similar to the position control system of FIGS. 3, 4A–4C, and 5A–5C. Therefore, a more detailed description of the digital position control system is omitted.

Figure 7A:
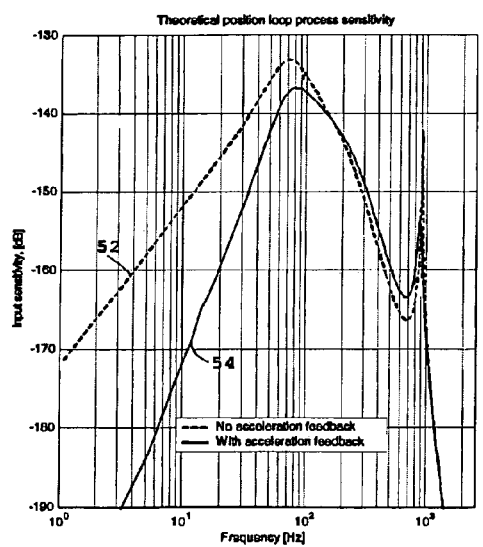
FIG. 7A and 7B are graphs illustrating the process sensitivity achieved with the block diagram of FIG. 6.
Figure 7B:
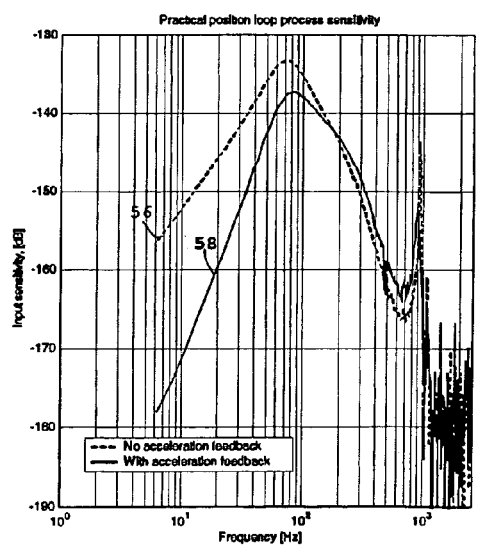

FIG. 7A illustrates theoretical and FIG. 7B illustrates practical results achieved with the embodiment described in relation to FIG. 6. The graphs in FIGS. 7A and 7B show the process sensitivity of the digital embodiment as a function of the frequency of the input disturbance force. The frequency on the horizontal axis has a logarithmic scale. The process sensitivity shown in FIGS. 7A and 7B is the position loop process sensitivity, i.e. the transfer function from a disturbance force Fd to the measured position error 4.

FIG. 7A shows the theoretical process sensitivity, both without and with acceleration feedback according to an embodiment of the present invention. Thus, the theoretical process sensitivity of a conventional digital position control system is shown with a dashed line 52. The theoretical process sensitivity of a position control system according to an embodiment of the present invention is shown with a continuous line 54. In practice, higher-order dynamics are present in the system. The resonance peak near 1 kHz results from such higher-order dynamics. These higher-order dynamics are included in the theoretical model used to calculate these theoretical results.

The process sensitivity of the system according to the present invention is clearly reduced with respect to the process sensitivity of the prior art system, especially for low frequencies. For a 10 Hz disturbance force, the process sensitivity is reduced with about 20 dB (a factor of 10). For frequencies higher than 200 Hz, but lower than 1 kHz, the process sensitivity is slightly increased, and for frequencies higher than 1 kHz, the process sensitivity is substantially the same as for a prior art system.

FIG. 7B shows a dashed line 56 for a conventional system and a continuous line 58 for a system according to the present invention. The graphs represent measured data and thus represent the actual position loop process sensitivity of the system. The process sensitivity of both the conventional system and the system according to an embodiment of the present invention do not substantially differ from the predicted theoretical process sensitivity illustrated in FIG. 7A. Note that above 1 kHz, measurement noise accounts for non-accuracy in the measurements, which can therefore not sensibly be compared with the theoretical results. Thus, the system according to the present invention functions as may be expected.

Figure 8:
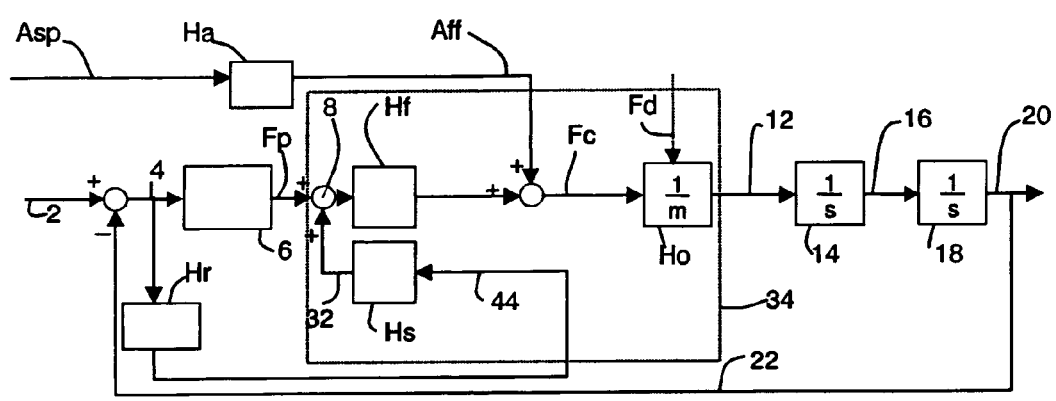
FIG. 8 is a schematic block diagram of a further embodiment of the present invention employing acceleration setpoint feedforward.

FIG. 8 illustrates another embodiment of the present invention. Again, a position controller 6 reacts on the difference between the position set point 2 and an actual position signal 20, similar to the first embodiment. In addition to the position controller force Fp, an acceleration set point feedforward Aff is present. The acceleration set point feedforward signal Aff is generated by a set point acceleration filter Ha, which has an input that equals the desired acceleration or set point acceleration Asp. Generally, the set point acceleration filter Ha includes an inverse of the object gain, in its simplest form equaling m, the object mass. The set point acceleration Asp substantially equals a double derivative with respect to time of the set point position, input at set point 2. The main goal of the set point acceleration feedforward is to accelerate the object such that its position matches the desired position without needing a mismatch between the desired and the actual position to make the position controller 6 react. Hence, the acceleration feedforward makes it possible for the object to closely follow its set point position without needing an input to the position controller 6.

It is observed that the acceleration set point feedforward signal Aff enters the system at a node that is comparable to the disturbance force Fd, as it is directly input into the object filter Ho. In the embodiment illustrated in FIG. 3, the acceleration control system 34 will attempt to diminish an effect of the acceleration set point feedforward signal Aff. It will be appreciated that the effect of the acceleration set point feedforward signal Aff should not be diminished.

Alternatively, the acceleration set point feedforward signal Aff could be added to the position controller force Fp. In that case, the acceleration control system 34 will not attempt to decrease the effect of the acceleration set point feedforward signal Aff. However, because the acceleration set point feedforward signal Aff now has to pass through the acceleration control system 34 which has more complicated dynamic characteristics than the object filter Ho itself, the set point acceleration filter Ha should be more complex. For that reason, it is desirable to let the acceleration set point feedforward signal Aff act directly on the object, as indicated in FIG. 8.

The problem that the acceleration control system 34 reacts on the acceleration caused by the acceleration feedforward may be solved by not feeding back the actual acceleration 12 through second filter Hs, but feeding an acceleration error signal 44 through second filter Hs. In such a case, only the acceleration not resulting from the acceleration set point feedforward signal Aff is fed back into the acceleration control system 34. The acceleration error signal 44 is deduced from the difference between the set point position 2 and the actual position 20 using an acceleration error reconstruction filter Hr, as indicated in FIG. 8. The acceleration error reconstruction filter Hr generally consists of a double differentiator that differentiates its input twice with respect to time. Because of the sign difference of the output of this reconstruction filter Hr compared to the original acceleration measurement signal 12, the output of second filter Hs is added to the position controller force Fp, instead of being subtracted from it. However, it will be appreciated that an inversion may be performed by a separate inverter to correct the sign difference of the output of the reconstruction filter Hr and then subtracting the resulting signal using subtractor 8.

While specific embodiments of the invention have been described above, it will be appreciated that the invention may be practiced otherwise than as described. For example, as stated above, the actual position may be measured instead of the acceleration, which will then be calculated from the measured position, or both the acceleration and the position may be measured, allowing to omit any calculation means therefor. Further, specific filter components may be included in Hl(s) to cope with higher-order effects in the object filter Ho, such as resonance's.

Further, while the invention has been described in relation to a lithographic projection apparatus, it should be understood that the present invention may be employed in any system controlling a position of an object. Therefore, the above description is not intended to limit the invention in any way—rather the scope of the invention is defined by the appended claims.

What is claimed is:

1. A lithographic apparatus comprising:
   (1) a moveable object, and
   (2) a position control system configured to control a position of said moveable object, the position control system comprising:
      (a) a position controller configured to output a position controller force;
      (b) a position feedback circuit configured to feed back a determined actual position of the moveable object to an input of the position controller, and
      (c) an acceleration control system including:
         (i) a first acceleration circuit branch comprising a subtractor into which the position controller force is input, and a first filter having a first gain into which the output of the subtractor is input, wherein said first filter is configured to output a control force which is to be exerted on the moveable object; and
         (ii) a second acceleration circuit branch comprising a second filter having a second gain and into which an acceleration control signal is input, the output of the second circuit branch being input into said subtractor to subtract the output of the second circuit branch from the position controller force.

2. The lithographic apparatus of claim 1, wherein the acceleration control system includes a first transfer function for the position control force input to the subtractor and a second transfer function for a disturbance force directly exerted on the moveable object, the first transfer function being substantially equal to an object gain and the second transfer function being generally smaller than the object gain, wherein the object gain substantially comprises an inverse of a mass of the moveable object.

3. The lithographic apparatus of claim 2, wherein the acceleration control system has a selected loop gain, the first transfer function, the second transfer function, and the loop gain being defined as:

$$G1 = \frac{1}{m},$$

$$G2 = \frac{1}{m + Kl},$$

and $$Kl = Kf \cdot Ks$$

where G1 is the first transfer function, G2 is the second transfer function and Kl is the loop gain.

4. The lithographic apparatus of claim 2, wherein the first transfer function does not substantially vary as a function of an input frequency, and wherein the second transfer function varies as a function of an input frequency.

5. The lithographic apparatus of claim 4, wherein the second transfer function increases with increasing input frequency.

6. The lithographic apparatus of claim 4, wherein the loop gain is provided by a frequency dependent loop filter, the frequency dependency of the first filter being defined as:

$$Hf(s) = 1 + \frac{Hl(s)}{m},$$

and the frequency dependency of the second filter being defined as:

$$Hs(s) = \frac{Hl(s)}{1 + \frac{Hl(s)}{m}}.$$

7. The lithographic apparatus of claim 6, wherein the loop filter is a second-order low-pass filter.

8. The lithographic apparatus of claim 6, wherein the loop filter is an integrator.

9. The lithographic apparatus of claim 6, wherein the position control system is a discrete time system.

10. The lithographic apparatus of claim 9, comprising at least one delay, said at least one delay including a process transfer function delay equaling $z^{-p}$ in series with the moveable object or an acceleration measurement delay equaling $z^{-q}$ in the second acceleration circuit branch in series with the second filter.

11. The lithographic apparatus of claim 10, wherein $$Hf(z) = 1 + Hl(z)\frac{z^{-(p+q)}}{m}, \text{ and}$$

$$Hs(z) = \frac{Hl(z)}{1 + Hl(z)\frac{z^{-(p+q)}}{m}}.$$

12. The lithographic apparatus of claim 1, wherein the moveable object is a substrate table or a patterning device table.

13. A position control system for controlling a position of a moveable object comprising;
    (a) a position controller configured to output a position controller force;
    (b) a position feedback circuit configured to feed back a determined actual position of the moveable object to an input of the position controller; and
    (c) an acceleration control system comprising;
        (i) a first acceleration circuit branch including a subtractor into which the position controller force is input and a first filter having a first gain and into which the output of the subtractor is input, wherein an output of the first filter provides a control force to be exerted on the moveable object; and
        (ii) a second acceleration circuit branch including a second filter having a second gain and into which an acceleration control signal is input, the output of the second circuit branch being input into said subtractor to subtract the output of the second circuit branch from the position controller force.

14. A device manufacturing method comprising:
controlling a position of a moveable object, said controlling including:
    (i) exerting a control force on said moveable object;
    (ii) determining an actual position of said moveable object;
    (iii) feeding back said actual position to an input of a position controller,
    (iv) subtracting a filtered acceleration control signal from a position controller force output by the position controller using a subtractor arranged in a first acceleration circuit branch;
    (v) filtering the output of the subtractor using a first filter having a first gain arranged in the first acceleration circuit branch;
    (vi) determining an acceleration of said moveable object;
    (vii) filtering an acceleration control signal using a second filter having a second gain and arranged in a second acceleration circuit branch; and
    (viii) supplying the output of the second acceleration circuit branch to the subtractor arranged in the first acceleration circuit branch.

15. The method of claim 14, further comprising:
patterning a beam of radiation; and
projecting the patterned beam of radiation onto a substrate held by said movable object.

16. The lithographic apparatus of claim 1, wherein said control force is input to an object filter and wherein an output of said object filter corresponds to said acceleration control signal.

17. The control system of claim 13, wherein said control force is input to an object filter and wherein an output of said object filter corresponds to said acceleration control signal.

* * * * *